(12) United States Patent
Sitzman et al.

(10) Patent No.: US 9,709,593 B1
(45) Date of Patent: Jul. 18, 2017

(54) APPARATUS FOR MEASURING VELOCITIES OF PROJECTILES LAUNCHED FROM FIREARMS

(75) Inventors: Alex J. Sitzman, Austin, TX (US); Garet L. Itz, Austin, TX (US); Joaquín M. Campos, Austin, TX (US); Weston D. Petersen, Austin, TX (US)

(73) Assignee: MAGNETOSPEED LLC, Austin, TX (US)

( * ) Notice: Subject to any disclaimer, the term of this patent is extended or adjusted under 35 U.S.C. 154(b) by 934 days.

(21) Appl. No.: 13/608,996

(22) Filed: Sep. 10, 2012

Related U.S. Application Data

(60) Provisional application No. 61/626,486, filed on Sep. 28, 2011.

(51) Int. Cl.
| | |
|---|---|
| *G01P 3/66* | (2006.01) |
| *G01P 3/64* | (2006.01) |
| *G01R 31/315* | (2006.01) |

(52) U.S. Cl.
CPC .................. *G01P 3/66* (2013.01); *G01P 3/64* (2013.01); *G01P 3/665* (2013.01); *G01R 31/315* (2013.01)

(58) Field of Classification Search
CPC .... G01P 3/665; G01P 3/64; G01P 3/66; G01P 3/685; G01R 31/315
USPC ............................................. 324/179
See application file for complete search history.

(56) References Cited

U.S. PATENT DOCUMENTS

| | | | | |
|---|---|---|---|---|
| 2,400,189 | A | * | 5/1946 | Carlson et al. ............... 324/179 |
| 4,677,376 | A | * | 6/1987 | Ettel et al. ..................... 324/179 |
| 4,734,870 | A | * | 3/1988 | Snyder et al. ................ 700/213 |
| 6,064,196 | A | * | 5/2000 | Oberlin et al. ............... 324/179 |
| 6,563,302 | B1 | * | 5/2003 | Raposa et al. ................ 324/179 |
| 2006/0060076 | A1 | * | 3/2006 | Dueck et al. .................. 89/14.4 |
| 2006/0290346 | A1 | * | 12/2006 | Habenschaden et al. ........................ 324/207.16 |
| 2008/0190191 | A1 | * | 8/2008 | Martin et al. ................... 73/167 |

* cited by examiner

*Primary Examiner* — Son Le
(74) *Attorney, Agent, or Firm* — Anthony P. Ng; Russell Ng PLLC

(57) ABSTRACT

A muzzle-mounted chronograph for measuring velocities of projectiles launched from firearms. The chronograph includes a sensor module and a controller. The sensor module includes a first and second coils and a device for applying a stable magnetic field to the first and second coils. The controller determines a velocity of a projectile passing by the first and second coils based on detected variations in magnetic fields at the first and second coils.

9 Claims, 4 Drawing Sheets

APPARATUS FOR MEASURING VELOCITIES OF PROJECTILES LAUNCHED FROM FIREARMS

PRIORITY CLAIM

The present application claims priority under 35 U.S.C. §119(e)(1) to provisional application No. 61/626,486, filed on Sep. 28, 2011, the contents of which are incorporated herein by reference.

BACKGROUND OF THE INVENTION

1. Technical Field

The present invention relates to velocimeter in general, and in particular to an apparatus for measuring velocities of projectiles launched from firearms.

2. Description of Related Art

Conventionally, two photodetectors are utilized to ascertain the velocity of a projectile fired from a firearm. The two photodetectors are required to be located several feet in front of the firearm in order to avoid optical emissions from the muzzle blast. The velocity of a projectile fired from a firearm is determined based on the time it takes for the projectile to pass between the two photodetectors. The major problem with this method is that a significant amount of time is required to set up the measurement configuration. Also, since the photodetectors are located relatively far away from the firearm, they can easily be struck by errant projectiles. In addition, photodetectors are known to lose accuracy, or even malfunction, in certain light conditions such as florescent lights, bright sunlight, or when the sun is low in the sky.

Consequently, it would be desirable to provide an improved apparatus for measuring velocities of projectiles launched from firearms.

SUMMARY OF THE INVENTION

In accordance with a preferred embodiment of the present invention, an apparatus for measuring velocities of projectiles launched from firearms includes a sensor module and a controller. The sensor module includes a first and second coils and a device for applying a stable magnetic field to the first and second coils. The controller determines the velocity of a projectile passing by the first and second coils based on detected variations in magnetic fields at the first and second coils.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
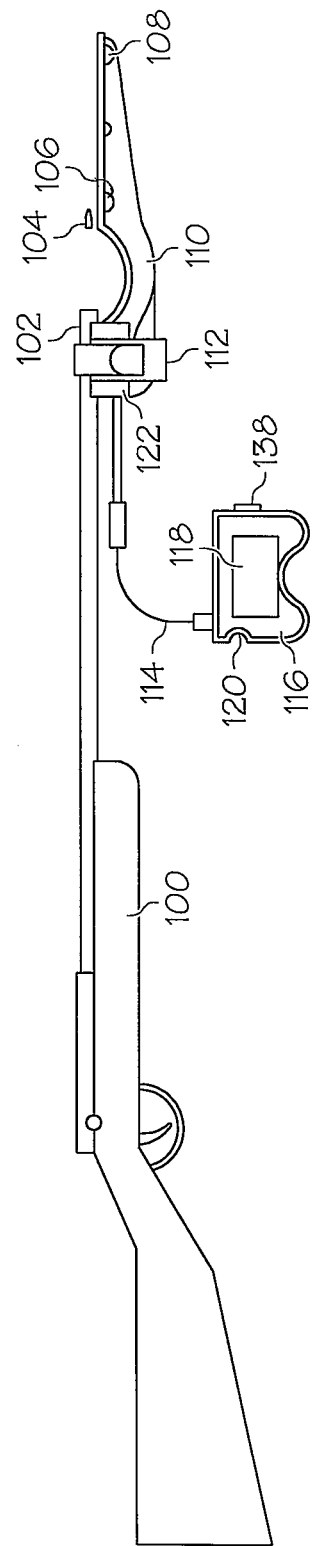
FIG. 1 shows an apparatus for measuring velocities of projectiles, in accordance with a preferred embodiment of the present invention.

Referring now to the drawings and in particular to FIG. 1, there is illustrated an apparatus for measuring velocities of projectiles, in accordance with a preferred embodiment of the present invention. As shown, an apparatus for measuring velocities of projectiles includes a sensor module 110 and a controller 116. Sensor module 110 includes a mounting cradle 122, a cam mechanism 112, and a pair of sensor coils 106, 108. Mounting cradle 122 is configured to be mounted on a muzzle of a firearm, such as a muzzle 102 of a firearm 100. Cam mechanism 112 can be used to secure sensor module 110 to muzzle 102.

Controller 116 includes a user input device 120 and a display 118. User input device 120 receives inputs from a user, and display 118 displays results to the user. Controller 116 also includes a slot 138 for receiving a removable memory device that allows a user to store data and transport the data to a separate computing device. Controller 116 is connected to sensor module 110 via a cable 114. Cable 114 is preferably a retractable flexible cable. Alternatively, controller 116 can be integrated into sensor module 110.

As a projectile 104 passes over each of sensor coils 106 and 108 in sequence, voltages are produced across each of sensor coils 106 and 108 in a manner that will be described infra. These voltages are then transmitted to controller 116, via cable 114 or wirelessly, for controller 116 to determine the velocity of projectile 104.

Figure 2A:
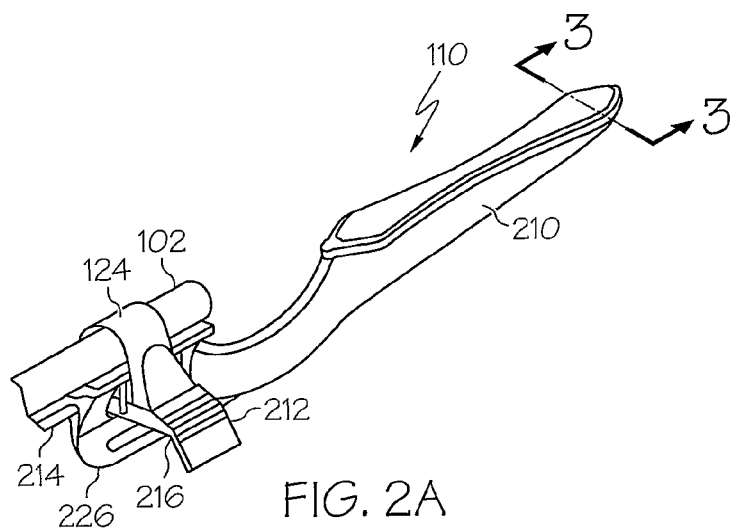
FIGS. 2A-2B are perspective views of a sensor module of the apparatus from FIG. 1 in an unlocked and locked positions, respectively.
Figure 2B:
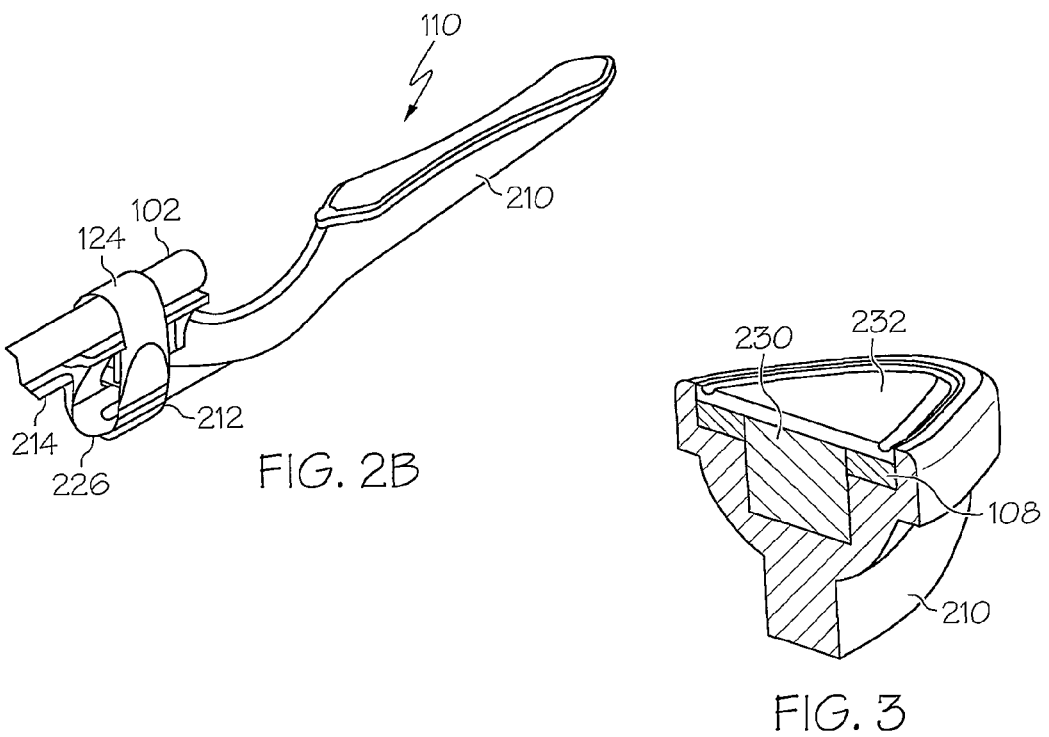

With reference now to FIGS. 2A-2B, there are depicted a perspective views of sensor module 110 in an unlocked position and locked positions, respectively. The body of sensor module 110 is largely comprised of a molded plastic structure 210. Stiffener 226 is made from a more rigid material, such as carbon fiber or fiberglass, to provide additional support. Stiffener 226 is partially contained within molded plastic structure 210. Cam mechanism 112 (from FIG. 1) includes a flexible strap 124 and a latching lever 212. Flexible strap 124 can be made from a hook and loop fastener, but it may also be made from another material such as rubber. Wire lead 214 is largely contained in a channel formed by molded plastic structure 210 and stiffener 226 so as to protect it from the muzzle blast of a firearm.

In FIG. 2B, latching lever lip 216 holds latching lever 212 to stiffener 226. The act of closing latching lever 212 tightens flexible strap 224 around muzzle 102.

Figure 3:
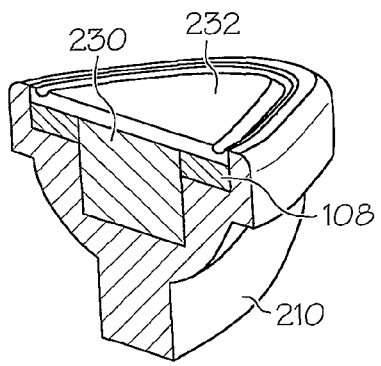
FIG. 3 is a cross-section view of the sensor module from FIG. 2A.

Referring now to FIG. 3, there is illustrated a cross-section view of sensor module 110 along line 3-3 in FIG. 2A. As shown, a permanent magnet 230 is surrounded by molded plastic structure 210. Sensor coil 108 is a wire coil formed within a printed circuit board. Preferably, sensor coil 108 is formed by a metal trace within a printed circuit board. Also, both sensor coils 106 and 108 can be formed by one metal trace within one printed circuit board. Permanent magnet 230 provides a stable magnetic field to sensor coil 108. An electromagnet made from a separate coil can also be utilized to provide a stable magnetic field to sensor coil 108. A top plate 232 is configured to provide protection for sensor coil 108 and permanent magnet 230 from muzzle blasts.

Figure 4:
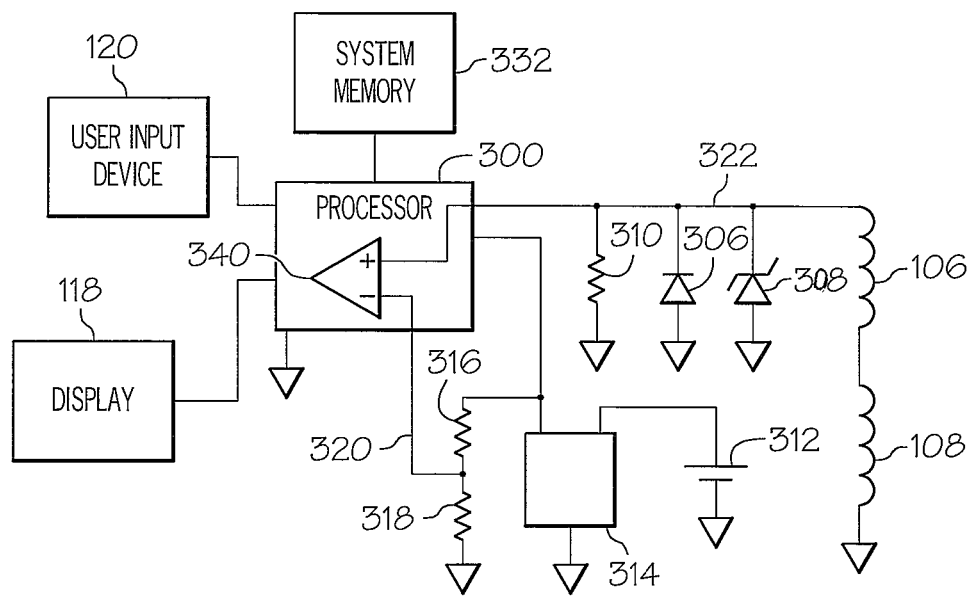
FIG. 4 is a block diagram of a controller of the apparatus from FIG. 1.

With reference now to FIG. 4, there is depicted a block diagram of controller 116 from FIG. 1. As shown, a processor 300 is connected to sensor coils 106 and 108 in series. Processor 300 is protected from excessive positive voltages via a Zener diode 308. In the event that the forward voltage drop across zener diode 308 is too high, processor 300 is protected from excessive negative voltages via a diode 306. A load resistor 310 is utilized to suppress noise. Multiple passive and active filters can be added to prevent noise from reaching processor 300.

A battery 312 provides a voltage that is regulated by a linear regulator 314. The voltage applied to linear regulator 314 is attenuated through a voltage divider formed by resistors 316 and 318. Alternatively, the voltage divider can also be made adjustable via the use of a potentiometer. The attenuated voltage is applied to processor 300 through a threshold voltage connector 320. Processor 300 contains an analog comparator 340 that is used to compare the voltage on a sensor signal connector 322 and the voltage on threshold voltage connector 320. A user can input information to processor 300 through user input device 120. Display 118 is used to provide visual information to the user. A removable memory device (not shown) can be used to transfer information stored within a system memory 332 to another computing device.

Figure 5:
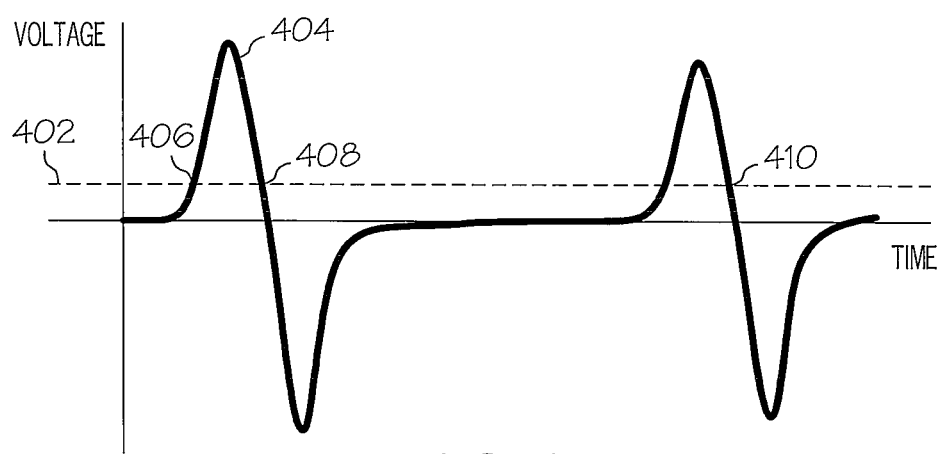
FIG. 5 is a waveform of the signal obtained from the sensor module from FIG. 2A.

Referring now to FIG. 5, there is illustrated a waveform produced by sensor module 110. As shown, a sensor signal 404 corresponds to the voltage on sensor signal connector 322 of FIG. 4, and threshold voltage 402 corresponds to the voltage on threshold voltage connector 320 of FIG. 4. A first positive crossing 406 is the first point at which sensor signal 404 becomes greater than threshold voltage 402. A first negative crossing 408 is the first point, after first positive crossing 406, at which sensor signal 404 becomes less than threshold voltage 402. A second negative crossing 410 is the second point at which sensor signal 404 crosses threshold voltage 402 in the negative direction. It is possible to use multiple voltage thresholds for signal detection or to digitize sensor signal 404 and detect crossings or peaks in the digital domain. It is also possible to replace analog comparator 340 with one or more zero-voltage crossing detectors.

Figure 6:
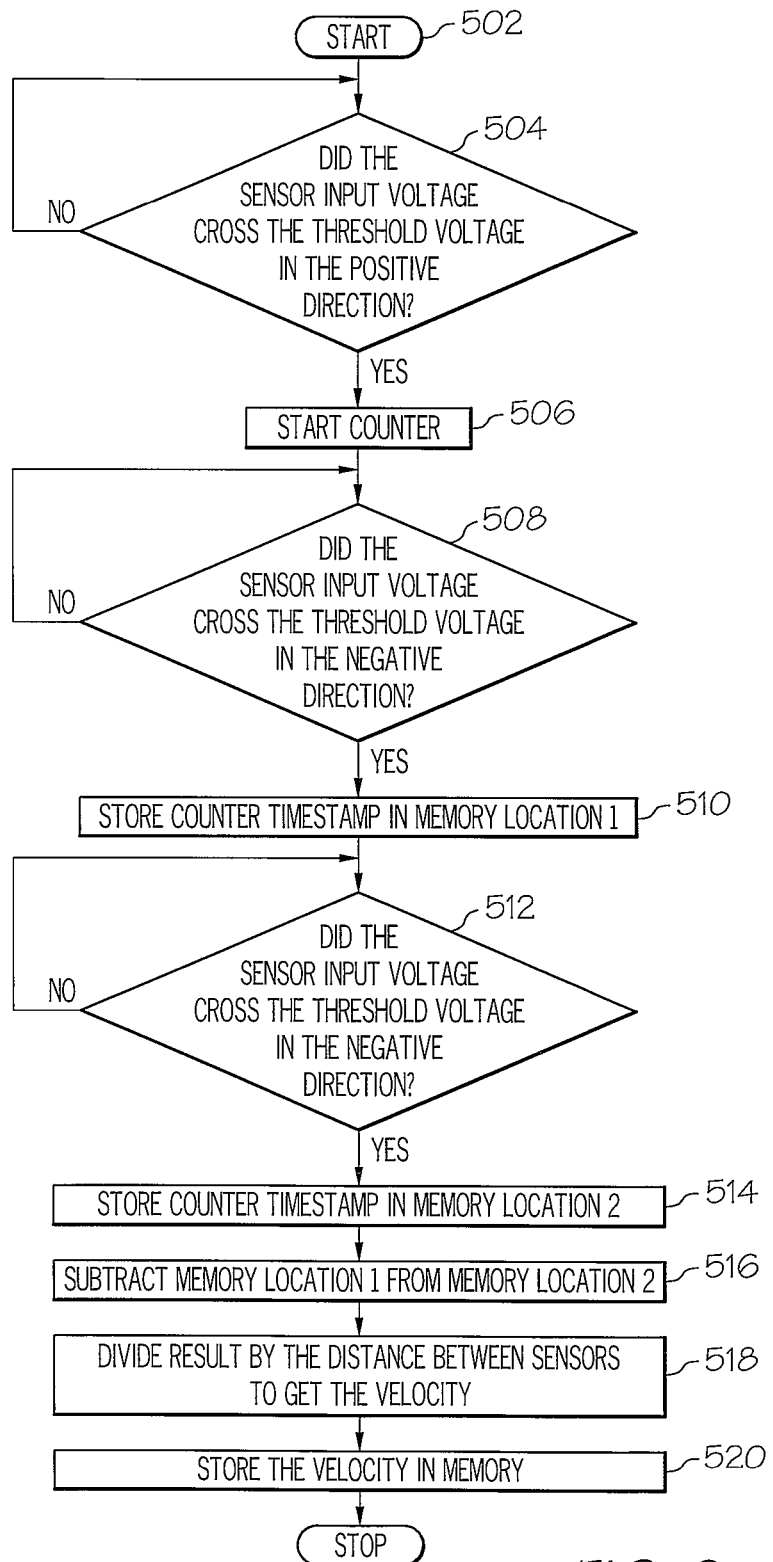
FIG. 6 is a flowchart of a method for measuring velocities of projectiles launched from firearms, in accordance with a preferred embodiment of the present invention.

With reference now to FIG. 6, there is illustrated a flowchart of a method for measuring the velocity of a projectile launched from a firearm, in accordance with a preferred embodiment of the present invention. Starting at block 502, a determination is made whether or not a sensor input voltage has crossed a threshold voltage in a positive direction (i.e., first positive crossing 406 from FIG. 5), as shown in block 504. If not, the process returns to block 504. If yes, a counter is started, as depicted in block 506. A determination is then made whether the sensor input voltage has crossed the threshold voltage in the negative direction (i.e., first negative crossing 408 from FIG. 5), as shown in 508. If not, the process returns to block 508. If yes, the counter timestamp is stored in a first memory location, as depicted in block 510.

Next, a determination is made whether or not the sensor input voltage has crossed the threshold voltage in the negative direction again (i.e., second negative crossing 410 from FIG. 5), as shown in 512. If not, the process returns to block 512. If yes, the counter timestamp is stored in a second memory location, as depicted in block 514.

The value stored in the first memory location is then subtracted from the value stored in the second memory location, as shown in block 516. The result from block 516 is divided by the distance between the two sensors to yield the projectile's velocity, as depicted in block 518. The result can be stored in a memory device and/or displayed on a visual output device, as shown in block 520.

As has been described, the present invention provides an improved apparatus for measuring velocities of projectiles launched from firearms.

While the invention has been particularly shown and described with reference to a preferred embodiment, it will be understood by those skilled in the art that various changes in form and detail may be made therein without departing from the spirit and scope of the invention.

What is claimed is:

1. An apparatus for measuring velocities of a projectile fired from a firearm, said apparatus comprising:
    a sensor module having
        a first coil and a second coil, wherein said first and second coils are formed by one metal trace within one printed circuit board; and
        a device for applying a stable magnetic field to said first and second coils; and
    a controller having
        a voltage comparator for detecting voltage variations caused by magnetic field variations at said first and second cods; and
        a processor for determining a velocity of a projectile passing by said first and second coils according to said detected voltage variations caused by said magnetic field variations at said first and second coils.

2. The apparatus of claim 1, wherein said controller further includes a sensor signal connector and a threshold voltages connector.

3. The apparatus of claim 2, wherein said voltage variations include voltage differences between sensor signal voltages on said sensor signal connector within said controller, and threshold voltages on said threshold voltage connector within said controller.

4. The apparatus of claim 1, wherein said voltage comparator is contained within said processor.

5. The apparatus of claim 1, wherein said projectile is non-magnetic.

6. The apparatus of claim 1, wherein said controller includes an user input device and a display.

7. The apparatus of claim 1, wherein said controller communicates with said sensor module via a cable.

8. The apparatus of claim 1, wherein said controller communicates with, said sensor module wirelessly.

9. An apparatus for measuring velocities of a projectile fired from a firearm, said apparatus comprising:
    a sensor module having
        a first coil and a second coil, wherein said first and second coils are formed by one metal trace within one printed circuit board; and
        a device for applying a stable magnetic field to said first and second coils; and
    a controller having
        a zero voltage crossing detector for detecting voltage variations caused by magnetic field variations at said first and second coils; and
        a processor for determining a velocity of a projectile passing by said first and second coils according to said detected voltage variations caused by said magnetic field variations at said first and second coils.

* * * * *